US012087869B2

(12) United States Patent
Bukkems et al.

(10) Patent No.: US 12,087,869 B2
(45) Date of Patent: Sep. 10, 2024

(54) ASSEMBLY FOR A SEMICONDUCTOR PHOTONIC COMPONENT

(71) Applicant: SIGNIFY HOLDING B.V., Eindhoven (NL)

(72) Inventors: Peter Johannes Martinus Bukkems, Deurne (NL); Barry Mos, Bocholt (BE)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/018,133

(22) PCT Filed: Jul. 15, 2021

(86) PCT No.: PCT/EP2021/069786
§ 371 (c)(1),
(2) Date: Jan. 26, 2023

(87) PCT Pub. No.: WO2022/023056
PCT Pub. Date: Feb. 3, 2022

(65) Prior Publication Data
US 2023/0275162 A1    Aug. 31, 2023

(30) Foreign Application Priority Data
Jul. 27, 2020   (EP) .................................. 20187825

(51) Int. Cl.
*H01L 31/02*    (2006.01)
*H01L 25/16*    (2023.01)
(Continued)

(52) U.S. Cl.
CPC ........ *H01L 31/0203* (2013.01); *H01L 25/167* (2013.01); *H01L 33/483* (2013.01)

(58) Field of Classification Search
CPC . H01L 31/0203; H01L 25/167; H01L 33/483; H01L 31/12; H01L 33/48; H01L 33/58
See application file for complete search history.

(56) References Cited

U.S. PATENT DOCUMENTS

2012/0063141 A1    3/2012 Otsuka
2019/0207051 A1    7/2019 Utsumi
(Continued)

FOREIGN PATENT DOCUMENTS

DE    4017201 A1    10/1991
EP    0898157 A1    2/1999
(Continued)

*Primary Examiner* — Tony Ko

(57) ABSTRACT

The invention relates to an assembly (10) for a semiconductor photonic component (31, 32), wherein the semiconductor photonic component (31, 32) is accommodated in an assembly housing (11) being shielded from the environment. Furthermore, the invention relates to an assembly housing (11) for use with such assembly for a semiconductor photonic component (31, 32). Accordingly, the assembly (10) at least comprising a substrate (30); at least one semiconductor photonic component (31, 32) mounted to the substrate (30), said at least one semiconductor photonic component (31, 32) including a photonic active surface element (31A, 32A); an assembly housing (11) for shielding the substrate (30) and the at least one semiconductor photonic component (31, 32) from the environment; the assembly housing (11) comprises a housing wall part (20, 20) provided with at least one photonic window element (21) facing the photonic active surface element (31A, 32A) of the at least one semiconductor photonic component (31), said at least one photonic window element (21) forming a monolithic part with the housing wall part (20, 20') and having a transmissivity being larger than the transmissivity of the housing wall part (20, 20').

12 Claims, 7 Drawing Sheets

(51) Int. Cl.
*H01L 31/0203* (2014.01)
*H01L 33/48* (2010.01)

(56) References Cited

U.S. PATENT DOCUMENTS

2019/0338915 A1  11/2019  Shum
2020/0105973 A1* 4/2020  Kasai ..................... H01L 33/58

FOREIGN PATENT DOCUMENTS

| EP | 1858086 | A1 | 11/2007 |
| EP | 2535954 | A1 | 12/2012 |
| EP | 3547378 | A1 | 10/2019 |
| WO | 2008117800 | A1 | 10/2008 |
| WO | 2020127163 | A1 | 6/2020 |

* cited by examiner

ASSEMBLY FOR A SEMICONDUCTOR PHOTONIC COMPONENT

CROSS-REFERENCE TO PRIOR APPLICATIONS

This application is the U.S. National Phase application under 35 U.S.C. § 371 of International Application No. PCT/EP2021/069786, filed on Jul. 15, 2021, which claims the benefit of European Patent Application No. 20187825.3, filed on Jul. 27, 2020. These applications are hereby incorporated by reference herein.

TECHNICAL FIELD

The invention relates to an assembly for a semiconductor photonic component, wherein the semiconductor photonic component is accommodated in an assembly housing being shielded from the environment. Furthermore, the invention relates to an assembly housing for use with such assembly for a semiconductor photonic component. Additionally, the invention relates to a housing wall part for use in an assembly housing. Finally, the invention relates to a lighting device comprising said assembly.

BACKGROUND OF THE INVENTION

Semiconductor photonic components are key parts in the field of light (photon) generation, detection, and manipulation through emission, transmission, modulation, signal processing, switching, amplification, and sensing. When implemented in sensing equipment, it is required to have the semiconductor photonic components properly sealed and protected against the external environment. Thus, it is common to house such photonic components in a sealed manner in an assembly housing in order to protect the sensitive components against a hazardous environment, such as water (moisture), chemicals, dust, etc.

It is known to mount such photonic components with sealing components or gaskets in or to the assembly housing preventing exposure of the photonic component to the hazardous external environment. However, such sealing measures do affect the functionality and accuracy of the photonic component, requiring counter measures for improving the accuracy. Additionally, the performance of semiconductor photonic components is also affected due to interaction with other electronic components of the sensing equipment.

Thus there is a need for an improved mounting and sealing technique for a semiconductor photonic component in an assembly housing, both providing a proper sealing against the environment as well as avoiding interference and unwanted noise from adjacent circuitry, which otherwise would adversely affect the accuracy of the photonic component.

DESCRIPTION OF THE INVENTION

Accordingly, an assembly for a semiconductor photonic component is proposed, with the assembly at least comprising a substrate; at least one semiconductor photonic component mounted to the substrate, said at least one semiconductor photonic component including a photonic active surface element; an assembly housing for shielding the substrate and the at least one semiconductor photonic component from the environment; the assembly housing comprises a housing wall part having an exterior surface provided with at least one photonic window element facing the photonic active surface element of the at least one semiconductor photonic component, said at least one photonic window element being a bottom wall of a recess in said exterior surface and forming a monolithic part with the housing wall part and having a transmissivity being larger than the transmissivity of the housing wall part.

By the photonic window element being the bottom of a recess, easier control is obtained of the screening or critical angle at which ambient light can directly imping, i.e. without being transmitted or reflected by other housing wall parts than the photonic window element, on the photonic element, thus better defining boundaries of, for example sensing, a target area. This screening or critical angle can further easily be controlled by the depth and/or width to depth ratio of the recess. The assembly for a semiconductor photonic component may have the feature that the recess has a side wall at least partly formed by upright housing wall sections and has a depth D which is larger than the thickness T of the housing wall part. In the description, the recess may also be referred to as cavity. Furthermore, the assembly for a semiconductor photonic component may have the feature that the recess has a width W at the exterior surface and depth D, wherein W/D is such that only light rays can directly imping on the at least one photonic window at an angle smaller than a critical angle βcritic, wherein βcritic <=40°, preferably <=25°, more preferably <=20°.

As the photonic window element is formed as an integral, monolithic part of the assembly housing no additional sealing measures are required. Furthermore as the photonic window element has a transmissivity for light, which is larger than the transmissivity of the housing wall part directly adjacent to the photonic window element, the functionality and accuracy of the semiconductor photonic component directly facing the photonic window element is not adversely affected. In addition, as the transmissivity of the housing wall part directly adjacent to the photonic window element is smaller than that of the photonic window element the semiconductor photonic component is not susceptible to interference and unwanted noise from its adjacent circuitry in the assembly housing, nor to stray noise from the outside environment.

In a preferred example of the assembly, the at least one photonic window element has a transmissivity of at least 10%, preferably between 10% and 30% and the housing wall part has a transmissivity of at the most 10%, preferably between 10% and 1%, in particular at the most of 3%.

In a functional embodiment, the at least one photonic window element has a thickness which is smaller than the thickness of the housing wall part.

In another functional embodiment of the assembly the housing wall part contains a light blocking dope.

In both examples, the functionality and accuracy of the semiconductor photonic component directly facing the photonic window element functions properly, and is not adversely affected by interference or noise from adjacent circuitry in the housing or from stray signals from the outside environment.

Preferably, the housing wall part is provided with a cavity accommodating the at least one photonic window element, with the housing wall part further comprising an upright housing wall section surrounding the cavity. Herewith a further constructional sealing of the semiconductor photonic component facing the photonic window element in the assembly housing is obtained, preventing interference, noise, and stray signalling from both inside the assembly housing (due to the adjacent circuitry) as from the outside environment.

Preferably, the assembly housing is made from a light transmissive material chosen from the group of polycarbonate, PMMA, polystyrene, etc.

In a further example the housing wall part is formed integrally with the assembly housing and in particular the housing wall part and the assembly housing form a monolithic part.

In yet another example the housing wall part is formed as an insert element in the assembly housing.

In an example, the at least semiconductor photonic element is a light emitting element, in particular a LED, whereas in another example the at least semiconductor photonic element is a light sensing element. In particular, the light sensing element is a photodiode, a phototransistor, or a photovoltaic cell.

The invention also pertains to an assembly housing for use with an assembly for a semiconductor photonic component as defined in the invention, wherein the assembly housing comprises a housing wall part provided with at least one photonic window element facing a photonic active surface element of the at least one semiconductor photonic component, with said at least one photonic window element forming a monolithic part with the housing wall part and having a transmissivity being larger than the transmissivity of the housing wall part.

Additionally, the at least one photonic window element has a transmissivity of at least 10%, preferably between 10% and 30% and the housing wall part has a transmissivity of at the most 10%, preferably between 10% and 1%, in particular at the most of 3% or the at least one photonic window element has a thickness which is smaller than the thickness of the housing wall part. In another functional embodiment of the assembly the housing wall part contains a light blocking dope.

In both examples, the functionality and accuracy of the semiconductor photonic component directly facing the photonic window element functions properly, and is not adversely affected by interference or noise from adjacent circuitry in the housing or from stray signals from the outside environment.

Preferably, the housing wall part is provided with a cavity accommodating the at least one photonic window element, with the housing wall part further comprising an upright housing wall section surrounding the cavity. Herewith a further constructional sealing of the semiconductor photonic component facing the photonic window element in the assembly housing is obtained, preventing interference, noise, and stray signalling from both inside the assembly housing (due to the adjacent circuitry) as from the outside environment.

Preferably, the assembly housing is made from a light transmissive material chosen from the group of polycarbonate, PMMA, polystyrene, etc.

The invention further relates to a lighting device comprising the assembly according to the invention, the lighting device typically is a flood light, spotlight, or luminaire such as a wall mounted luminaire, a recessed luminaire, as suspended luminaire, and a free standing luminaire.

DESCRIPTION OF THE DRAWINGS

The invention will now be discussed with reference to the drawings, which show in.

DETAILED DESCRIPTION OF THE DRAWINGS

Figure 1:
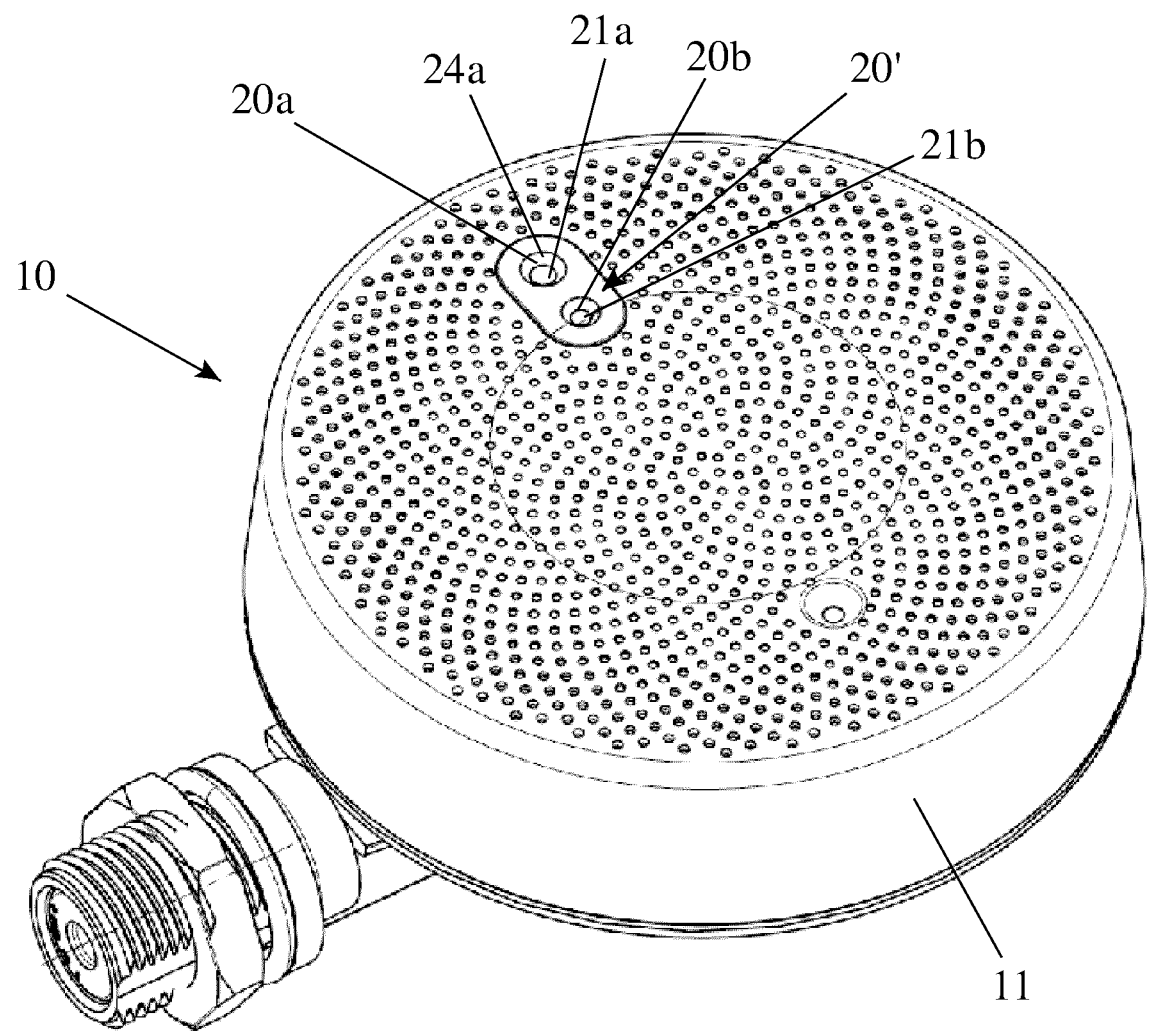
FIGS. 1-5 schematically illustrate examples of embodiments of an assembly and an assembly housing according to the present disclosure.

For a proper understanding of the invention, in the detailed description below corresponding elements or parts of the invention will be denoted with identical reference numerals in the drawings.

FIGS. 1-5 schematically illustrate non-limiting examples of embodiments of an assembly and an assembly housing according to the present disclosure.

The assembly for at least one semiconductor photonic component is in general fashion denoted with reference numeral 10. It is to be understood in this patent application that the assembly for the at least one semiconductor photonic component can perform different and even combined photonic applications in the range of visible and near-infrared light, such as light (photon) generation, detection, and manipulation through emission, transmission, modulation, signal processing, switching, amplification, and sensing.

In this patent application examples are described of an assembly incorporating one or more semiconductor photonic components capable of light sensing and light emission. However, also other examples are considered feasible, in combination with the configurations of the assembly housing described hereafter.

The assembly 10 is constructed as a module containing suitable electronic circuitry and one or more semiconductor photonic components. The module of the assemble is for example arranged to be mounted to a device for measurement purposes. However, the assembly 10 can also be used as a stand-alone module.

Usually such assemblies 10 are used in hazardous environments, where either high (or low) temperatures and pressures can occur and/or as where water (moisture), chemicals, dust or other aggressive and/or abrasive and/or corrosive media. Therefor the assembly 10 needs to properly seal and protect the electronic components, such as the circuitry and the semiconductor photonic components against these external influences. It is common to house these sensitive parts (circuitry and photonic components) in a sealed manner in an assembly housing using sealing components or gaskets in or to the assembly housing, thus preventing exposure of the sensitive parts and in particular the photonic component to the hazardous external environment.

However, such sealing measures do affect the functionality and accuracy of the photonic component, requiring counter measures for improving the accuracy. Additionally, the performance of semiconductor photonic components is also affected due to interaction with other electronic components of the sensing equipment.

As shown in FIGS. 2-5 the assembly 10 houses a substrate or printed circuit board (PCB circuitry) 30 on which the necessary electronic components are mounted for data collection and processing. The PCB 30 also houses at least one semiconductor photonic element, indicated with reference numeral 31 in FIGS. 2, 3 and 4, and with reference numerals 31 and 32 in FIG. 5.

As outlined the at least one semiconductor photonic element 31 and 32 can be used for many applications in the range of visible and near-infrared light, such as light (photon) generation, detection, and manipulation through emission, transmission, modulation, signal processing, switching, amplification, and sensing. In the embodiment of FIGS. 2-5 the semiconductor photonic element (of a first type) 31 is implemented as a light detecting element, whereas the semiconductor photonic element (of a second type) 32 in FIG. 5 is implemented as light emitting elements, in particular one or more LEDs. As a general remark is it noted, that for the sensor type, the light sensing type should be able to receive a sufficient amount of light, while for a light emitting type, the light should be visible for the user.

Both examples of semiconductor photonic elements (of the first and second type) 31 and 32 include a photonic active surface element, indicated with reference numeral 31a and 32a, respectively.

Reference numeral 11 depicts an assembly housing of the assembly 10, which assembly housing 11 serves as a shielding for the substrate 30 and the at least one semiconductor photonic component 31-32 from the environment, as shown in FIG. 1 and in detail in the FIGS. 2-5.

Figure 2:
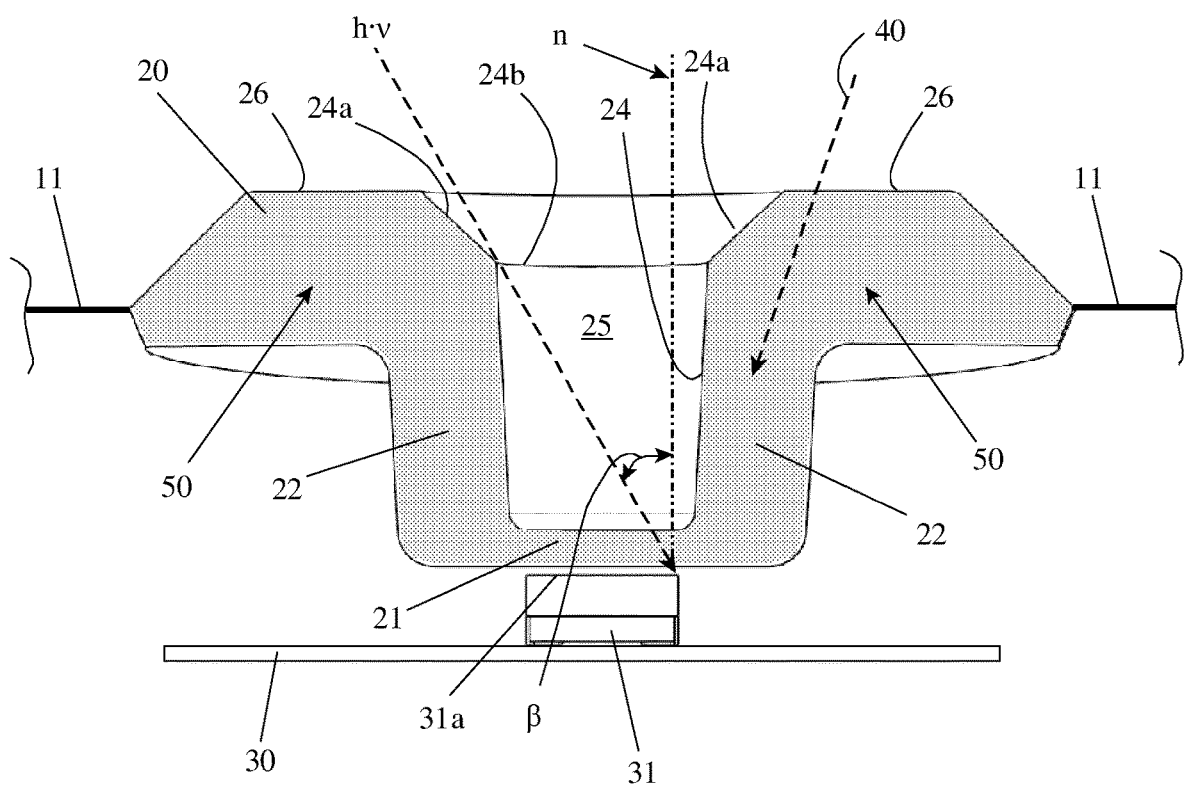
Figure 3:
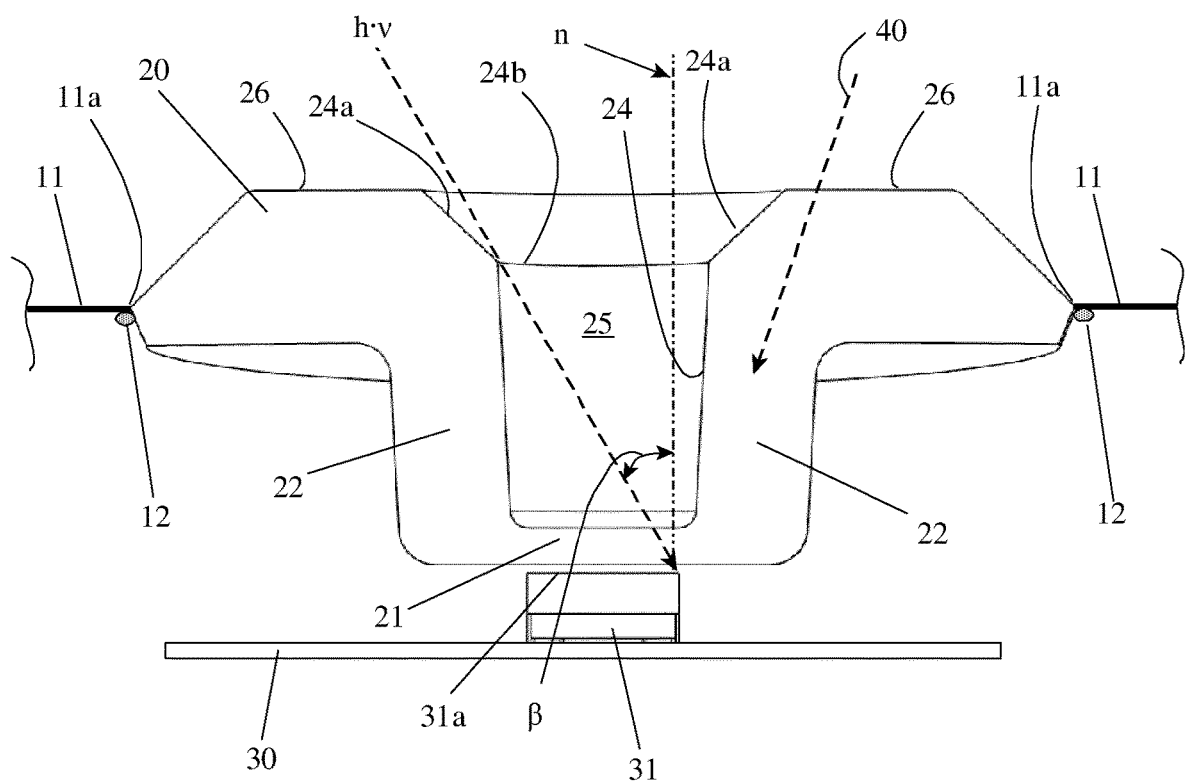
Figure 4:
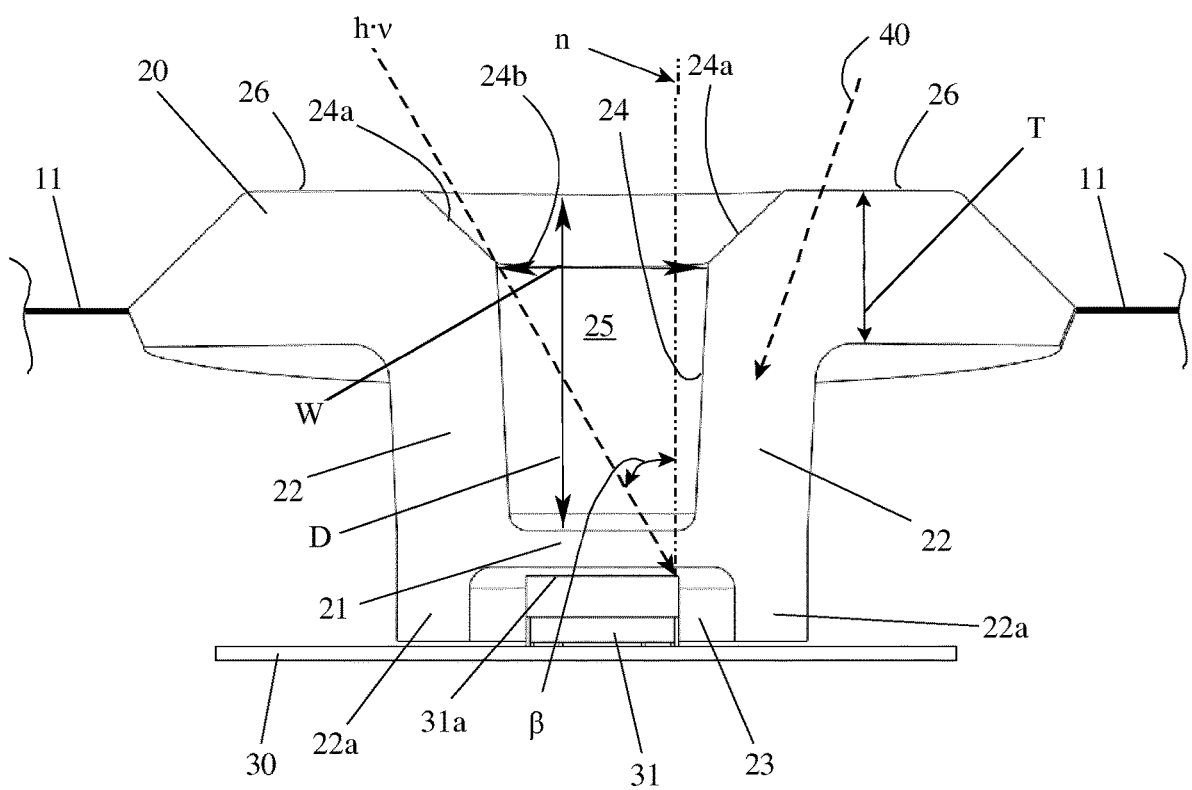
Figure 5:
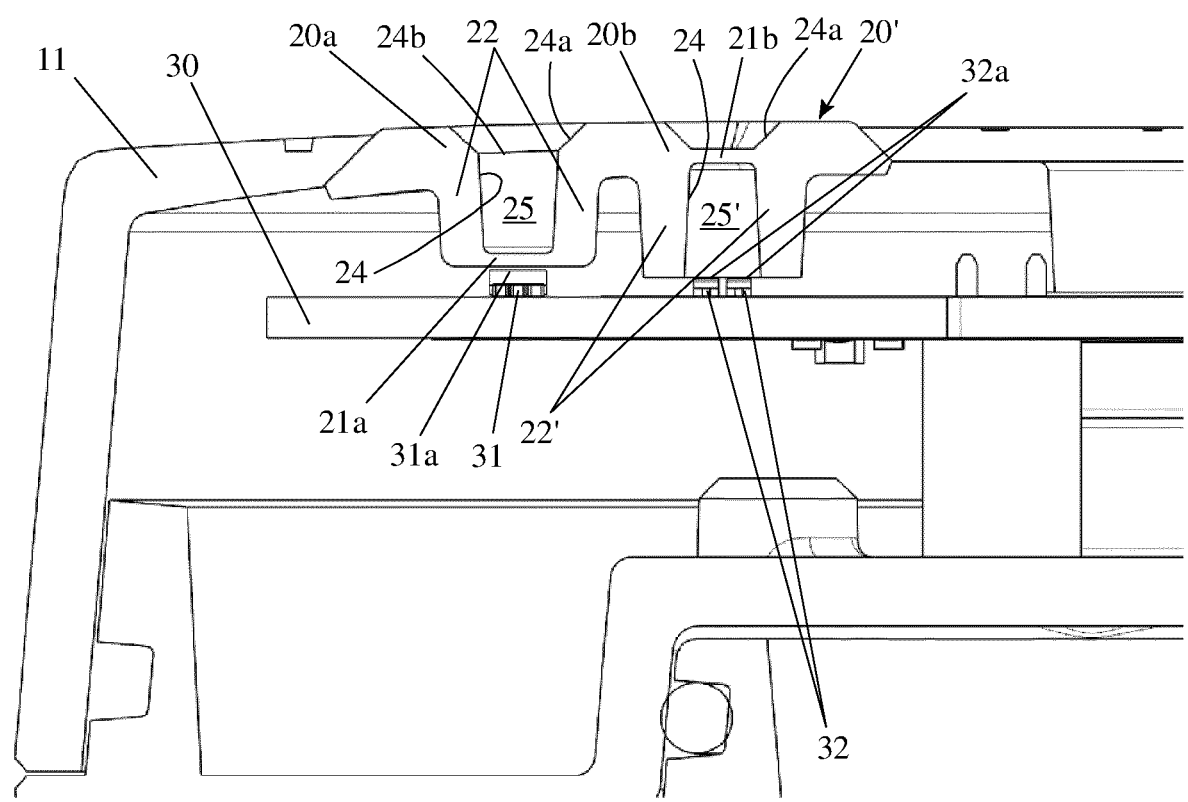

The assembly housing 11 comprises a housing wall part, indicated with reference numeral 20' in FIGS. 1 and 5 and with reference numeral 20 in FIGS. 2, 3 and 4. The housing wall part 20 respectively is provided with one photonic window element 21 in the examples of FIGS. 2, 3 and 4. In FIGS. 1 and 5 the housing wall part 20' is provided with a first and second assembly housing wall section parts 20a-20b respectively, each assembly housing wall section part 20a-20b being provided with a photonic window element 21a and 21b, respectively. It will be clear that multiple photonic window elements (more than two, such as three or four or even more) can be present in the housing wall part 20-20' or even present in multiple housing wall parts 20-20' of the assembly 10 depending on its photonic application.

Each photonic window element 21 (21a-21b) faces the photonic active surface element 31a (32a) of the respective semiconductor photonic component 31-32 mounted to the PCB substrate 30. Herewith the semiconductor photonic component 31 (acting as a light detecting element) is capable for sensing light impinging on the photonic window element 21-21a under a certain impinging angle β or can light being emitted by the semiconductor photonic component 32 (acting as a light emitting element, LED) exit the photonic window element 21b.

In the examples depicted, the assembly housing 11/the housing wall part 20-20' can be provided with photonic entry/exit cavities 25-25', both cavities 25-25' being formed by photonic window element 21 (21a-21b) and upright housing wall sections 22-22' surrounding the cavities 25-25'. The cavities 25-25' serve as entry or exit areas for light entering or exiting the assembly 10 through the respective photonic window elements 21 (21a-21b).

Usually in the prior art, such photonic window element 21 (21a-21b) is mounted in a sealed manner in the assembly housing by means of additional sealing means such as a sealing gasket. However, such sealing measures do affect the functionality and accuracy of the photonic component 21 (21a-21b), requiring counter measures for improving the accuracy. Such counter measures may incorporate increasing the photonic window element, which however might result in capturing noisy and stray light (in the example of a light sensing element as the photonic component 21. Another counter measure for improving the accuracy of the photonic element 21 (functioning as a light sensing element) is blackening the surfaces 24 of the upright housing wall sections 22 surrounding the entry cavity 25.

In an application of the assembly 10, wherein the photonic component 21 acts as a light sensing element, the entry surfaces 24 of the upright housing wall sections 22-22' are often blackened in an additional process step. This blackening is performed in order limit the influence of light entering under different impinging angles 13 the cavity 25 from outside the target area directly facing the photonic window element 21 and the photonic active surface element 31a of the semiconductor photonic component 31 (light sensing element).

However, such additional blackening process step is practically cumbersome because of the very small dimensions (diameter and depth) of the entry cavity 25 and the risk of damaging or blackening the photonic window element 21, which results in a reduced sensing performance of the light sensing element 31.

A same consideration applies to the exit cavity 25' (FIG. 5) being formed and surrounded by the upright housing wall section 22' and the photonic window element 21b, the latter facing the photonic active surface element 32a of the light emitting elements 32.

Accordingly, in the present invention the photonic window element 21a-21b forms a monolithic part with the housing wall part 20-20' (20a-20b) and has a transmissivity being larger than the transmissivity of the housing wall part 20-20'. By forming the photonic window element 21a-21b as an integral, monolithic part of the housing wall part 20-20' and the assembly housing 11 no additional sealing measures are required. Furthermore as the photonic window element 21a-21b has a transmissivity for light, which is larger than the transmissivity of the housing wall parts 20-20' and in particular the upright housing wall sections 22-22' directly adjacent to the photonic window element 21a-21b, the functionality and accuracy of the semiconductor photonic component 31-32 directly facing the photonic window element 21a-21b is not adversely affected.

In addition, as the transmissivity of parts of the housing wall part 20-20' (upright housing wall sections 22-22') directly adjacent to the photonic window element 21a-21b is smaller than that of the photonic window element 21a-21b itself, the semiconductor photonic component 31-32 is not susceptible to interference and unwanted noise from its adjacent circuitry mounted on the PCB substrate 30 in the assembly housing, nor to stray noise from the outside environment.

This latter advantage is further improved by providing the housing wall part 20-20' with an additional mounting cavity 23 (see FIG. 4) in which the semiconductor photonic element 31 is accommodated. The mounting cavity 23 is formed and surrounded by the PCB substrate 30, the photonic window element 21a and additional upright housing wall sections 22a, which upright housing wall sections 22a are an extension of the upright housing wall section 22.

Herewith the performance and accuracy of the semiconductor photonic element 31, which can be a light sensing element 31, is not adversely influenced by for example stray light being emitted by a light emitting element 32, which is mounted directly next to this light sensing element 31 on the same PCB substrate 30. Accordingly, the light sensing element 31 will sense only light from the target area directly facing and entering via the chamfer surface 24a and the chamfer transition line 24b the entry cavity 25 and the light sensing element 31 will sense only that light due to the lower transmissivity of the housing wall part 20-20' in particular the upright housing wall sections 22-22' and the higher transmissivity of the photonic window element 21a.

In an example, the integral, monolithic constructional housing wall part 20-20' including the photonic window element 21a-21b is formed integrally with the assembly housing, in particular the housing wall part 20-20' and the assembly housing 11 form a monolithic part. This embodiment is for example depicted in FIG. 2 and FIG. 4, wherein the assembly housing 11 and the housing wall part 20-20' are manufactured for example by means of plastic (injection) moulding.

In another examples, the housing wall part 20-20' is formed as an insert element in the assembly housing 11. These embodiments are for example shown in FIGS. 3 and 5, wherein the assembly housing 11 is provided with a mounting hole or opening 11a. The inner dimensions of the mounting opening 11a are conformal to an outer dimension of the housing wall part 20-20' allowing the housing wall part 20-20' to be mounted in the mounting opening 11a either by means of a click or snap connection or by means of a glue 12.

Preferably, the photonic window element 21a-21b and the housing wall part 20-20', forming one integral, monolithic constructional part, are made from the same material, preferably a light transmissive plastic material chosen from the group of polycarbonate, PMMA, polystyrene, styrene-acrylonitrile, polypropylene, silicone, polyurethane, etc. Such plastic materials can be easily processed for example by means of plastic (injection) moulding.

In an embodiment the at least one photonic window element 21a-21b has a transmissivity of at least 10% and the remaining housing wall part 20-20' and in particular the upright housing wall sections 22-22' and the additional upright housing wall section 22a has a transmissivity of at the most 1%.

As the entire integral, monolith part composed of the housing wall part 20-20' (20a-20b) including one or more photonic window elements 21a-21b- . . . -etc. preferably is manufactured from the same plastic material, the difference in transmissivity between the photonic window element 21a-21b and the rest of the housing wall part 20-20' (20a-20b) is established, by providing the at least one photonic window element 21a-21b with a thickness which is smaller than the thickness of the housing wall part directly adjacent to it, that is the upright housing wall sections 22-22' and the additional upright housing wall section 22a.

In another example for establishing said difference in transmissivity the housing wall part directly adjacent to the at least one photonic window element 21a-21b contains a light absorbing or blocking dope. In one embodiment, the material forming the housing wall part 20-20' (20a-20b) excluding the photonic window elements 21a-21b is provided a light absorbing or blocking dope. In another embodiment, only the material of parts of the housing wall part 20-20' (20a-20b) directly adjacent to the photonic window elements 21a-21b, hence the upright housing wall sections 22-22' and the additional upright housing wall section 22a, are provided with such light absorbing or blocking dope.

Suitable light absorbing or blocking dopes added to the material of the housing wall part are carbon black, graphite, or colour dies. Also diffuse materials could be used, such as additives or materials having a lower or higher index of refraction than the base material of the of the housing wall part 20-20', Examples of such materials having a lower or higher index of refraction are silicone particles, $TiO_2$ particles, etc. which particles lower the light transmission from and to the faces the photonic active surface element 31a (32a) of the respective semiconductor photonic component 31-32 mounted to the PCB substrate 30.

Also, combinations of a light absorbing dope and light scattering dope could be used.

A combination of both examples of establishing said difference in transmissivity is also possible, thus an integral, monolith part composed of the housing wall part 20-20' (20a-20b) including one or more photonic window elements 21a-21b implementing both a difference in thickness as well as the use of a light absorbing or blocking dope as described above.

FIG. 2 depicts in a schematic manner the presence of the light absorbing or blocking dope as reference numeral 50 in the upright housing wall sections 22 surrounding the entry cavity 25 and next to the photonic window element 21, in which the light absorbing or blocking dope 50 is absent. Note that in the embodiments of FIG. 3-5 the light absorbing or blocking dope 50 can be provided in a similar manner to the material of the housing wall part 20-20', which material form the upright housing wall sections 22-22' and the additional upright housing wall section 22a.

Light, in FIGS. 2-4 depicted as light beam 40, impinging on the exterior surface 26 of the housing wall part 20-20' directly adjacent to the entry cavity 25, will thus be absorbed by the light absorbing or blocking dope 50 contained in the housing wall sections 22, thereby preventing the light beam 40 from penetrating fully through the housing wall sections 22 and reaching the photonic active surface element 31a of the semiconductor photonic elements 31, either directly or via the entry cavity 25 and the photonic window elements 21.

Figure 6:
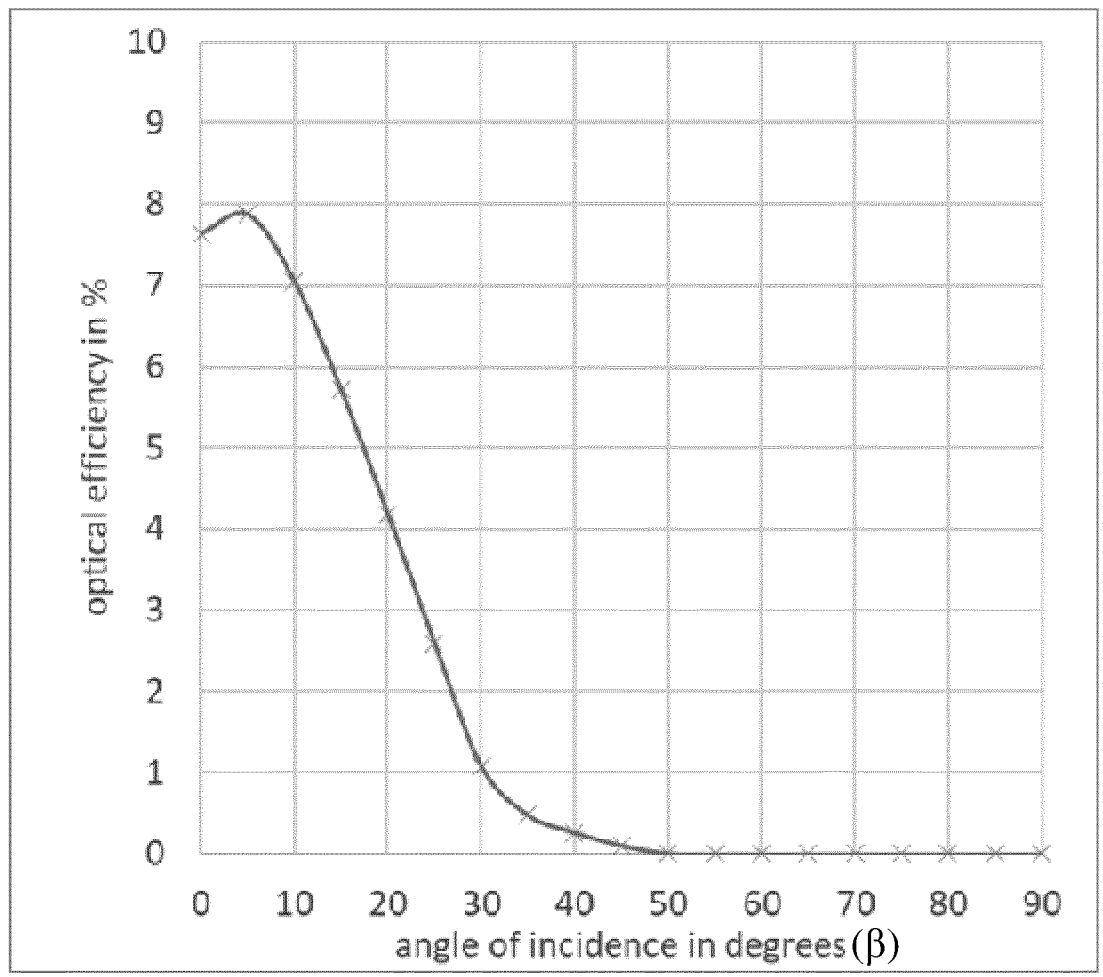
FIG. 6 schematically illustrates an example of the optical efficiency (in %) of the integral, monolithic housing wall part according to the invention.

FIG. 6 depicts an experimental result of the assembly 10 and in particular the assembly housing 11 according to the invention. The graph shows along its vertical (y) axis the optical efficiency (in %) of the integral, monolithic housing wall part 20 (20a) provided with a photonic window element 21a exhibiting a difference in transmissivity as described above. The horizontal (x) axis shows the angle β between light impinging the photonic active surface element 31a and the normal line n perpendicular to the surface of the photonic active surface element 31a. The photonic window element 21a-21b (as well as the interacting entry cavity 25) are facing a target area from which light originates, which light is captured and detected by the photonic active surface element 31a of semiconductor photonic element (light sensing element) 31.

The graph in FIG. 5 shows the effect of reduced/limited transmissivity of the material of the surface 24 of the upright housing wall section 22 surrounding the entry cavity. Light entering the cavity 24 and impinging under small angles of incidence 0°<β<25° relative to the normal linen surface 24 of the upright housing wall section 22 can still impinge on the photonic window element 21a and be detected the semiconductor photonic component 31.

Due to the reduced transmissivity and in particular due to the light absorbing or blocking dope in the material of the upright housing wall section 22 surrounding the cavity 25 as well the dimensions, height/depth D (at least partly formed by upright wall sections 24) and diameter/width W (at the exterior surface 26), and the ratio W/D of the cavity 25 are such that light impinging on the upright housing wall section 22 under an angle of incidence β>20-25° is directly absorbed by the upright housing wall section 22 and will not impinge on the photonic window element 21a and thus not detected by the semiconductor photonic component 31. Furthermore, as shown, the depth D of the cavity/recess 25 is larger than the thickness T of the housing wall part 20.

This critical angle $\beta_{critic}$ is for example shown in the FIGS. 2 and 3 by means of the h·v arrow, which indicates a light beam entering the cavity 25 whilst grazing the chamfer surface 24a and the chamfer transition line 24b and which is thus barely sensed/detected by the photonic active surface element 31a of the semiconductor photonic sensing element 31.

Figure 7:
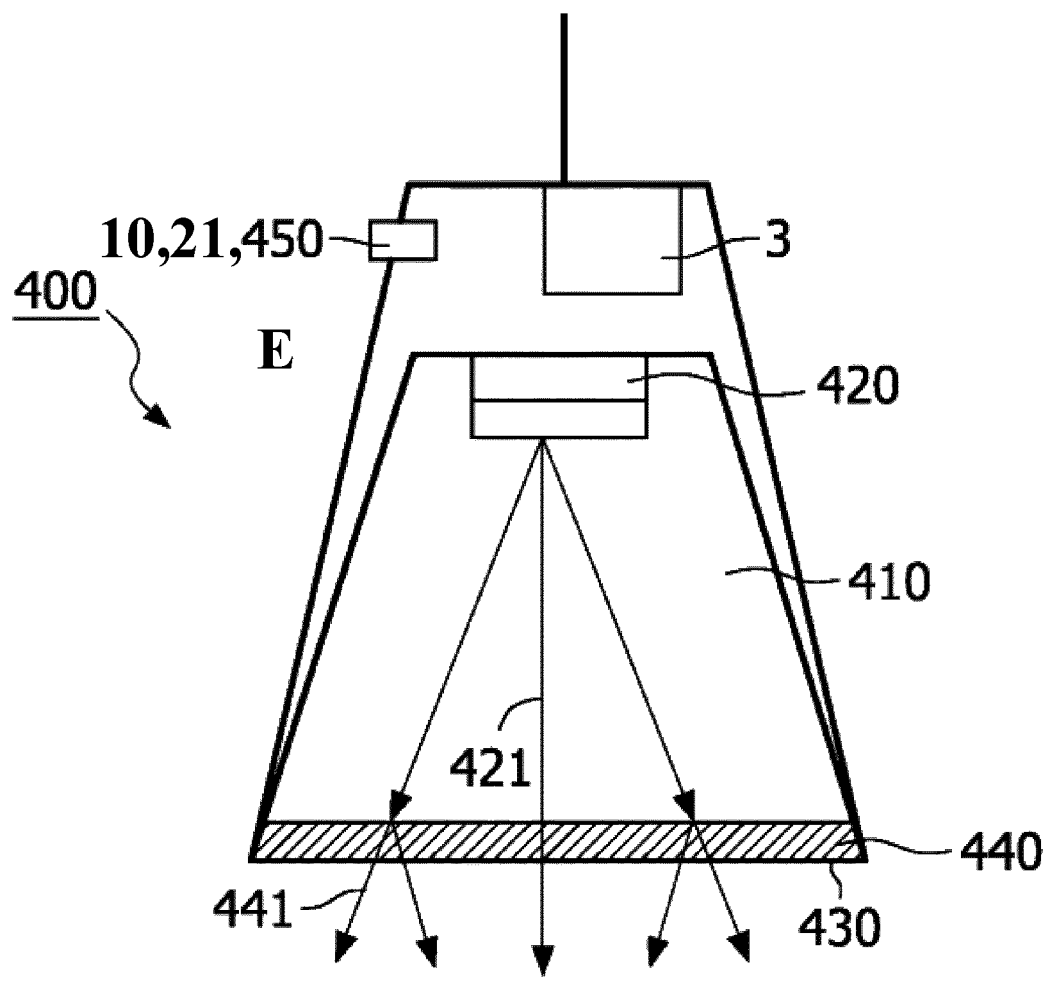
FIG. 7 schematically illustrates an example of a luminaire according to the invention.

FIG. 7 shows a suspended down-light luminaire 400 suitable for indoor illumination purposes. The luminaire 400 comprises an optical cavity 410 in which at least one LED 420 is assembled. The LEDs 420 are able to emit LED light 421. Furthermore, the luminaire 400 comprises a transparent window 430 covering the optical cavity 410 through which the light generated by the LED(s) 420 can be transmitted. The window 430 is provided with a diffusing coating or layer 440, for instance through silkscreen printing, spin coating or any other appropriate coating technology known in the art, rendering light 421 to be issued from the luminaire as diffused light 441. The luminaire 400 comprises an assembly 10 according to the invention, said assembly comprising a light sensing element 21, in the FIG. a photo sensor 450, to detect ambient lighting level E of the environment. The control means 3 adjusts the residual current to the LED(s) 420 in relation to the lighting level E, based on the sensor signal. This is beneficial, as higher ambient lighting levels require a larger residual current in order to outshine the reflected ambient light. Moreover, at lower ambient lighting levels the residual current can be reduced making the luminaire 400 more energy efficient. In fact, the residual current can be set to zero below a predetermined ambient lighting level.

LISTING OF REFERENCE NUMERALS USED 3 control means
10 assembly for a semiconductor photonic component
11 assembly housing
11a mounting opening in assembly housing
12 click/snap connection—glue
20 housing wall part (FIGS. 2 and 3 and 4)
20' housing wall part (FIGS. 1 and 5)
20a first assembly housing wall part (FIGS. 1 and 5)
20b second assembly housing wall part (FIGS. 1 and 5)
21 photonic window element (FIGS. 2 and 3 and 4)
21a photonic window element of the first type (FIGS. 1 and 5)
21b photonic window element of the second type (FIGS. 1, 3 and 4)
22-22' upright housing wall section of housing wall part
22a additional upright housing wall section of housing wall part
23 mounting cavity in housing wall part
24 entry surfaces of upright housing wall section
24a chamfer surface of entry cavity 25
24b chamfer transition line
25 entry cavity in housing wall part
25' exit cavity in housing wall part
26 exterior surface of housing wall part
30 substrate or printed circuit board or circuitry
31 semiconductor photonic element of the first type (sensing type)
31a photonic active surface element of semiconductor photonic element of the first type
32 semiconductor photonic element of the second type (emitting type)
32a photonic active surface element of semiconductor photonic element of the second type
40 light beam
50 light absorbing or blocking dope
400 luminaire
410 optical cavity
420 LED
421 LED light
430 window
440 diffusing coating or layer
441 diffused light
450 photo sensor
E ambient lighting level

The invention claimed is:

1. An assembly for a semiconductor photonic component, the assembly at least comprising:
a substrate;
at least one semiconductor photonic component mounted to the substrate, said at least one semiconductor photonic component including a photonic active surface element;
an assembly housing for shielding the substrate and the at least one semiconductor photonic component from the environment;
the assembly housing comprises a housing wall part having an exterior surface and being provided with at least one photonic window element facing the photonic active surface element of the at least one semiconductor photonic component, said at least one photonic window element being a bottom wall of a recess in said exterior surface and forming a monolithic part with the housing wall part,
wherein the at least one photonic window element has a thickness which is smaller than a thickness of the housing wall part for having a transmissivity being larger than the transmissivity of the housing wall part, the recess has a side wall at least partly formed by upright housing wall sections and has a depth D which is larger than the thickness T of the housing wall part, and
wherein the housing wall part contains a light absorbing dope and/or light blocking dope.

2. The assembly for a semiconductor photonic component according to claim 1, wherein the recess has a width W at the exterior surface and depth D, wherein D/W is such that only light rays can directly imping on the at least one photonic window at an angle smaller than a critical angle $\beta_{critic}$, wherein $\beta_{critic}$ <=40°, preferably <=25°, more preferably <=20°.

3. The assembly for a semiconductor photonic component according to claim 1, wherein the at least one photonic window element has a transmissivity of at least 10%, preferably between 10% and 30% and the housing wall part has a transmissivity of at the most 10%, preferably between 10% and 1%, in particular at the most of 3%.

4. The assembly for a semiconductor photonic component according to claim 1, wherein the housing wall part is made from a light transmissive plastic material, wherein the plastic material preferably is chosen from the group of polycarbonate, PMMA, polystyrene, styrene-acrylonitrile, polypropylene, silicone, polyurethane.

5. The assembly for a semiconductor photonic component according to claim 1, wherein the housing wall part is formed integrally with the assembly housing.

6. The assembly for a semiconductor photonic component according to claim 5, wherein the housing wall part and the assembly housing form a monolithic part.

7. The assembly for a semiconductor photonic component according to claim 5, wherein the housing wall part is formed as an insert element in the assembly housing.

8. The assembly according to claim 1, wherein the at least semiconductor photonic element comprises a light emitting element, in particular a LED and/or a light sensing element.

9. The assembly according to claim 8, wherein the light sensing element is a photodiode, a phototransistor, or a photovoltaic cell.

10. An assembly housing for use with an assembly for a semiconductor photonic component as defined in claim 1.

11. A housing wall part for use in an assembly housing as defined in claim 1.

12. A luminaire comprising an assembly for a semiconductor photonic component as defined in claim 1.

* * * * *